US012795878B2

(12) United States Patent
Hamstra et al.

(10) Patent No.: US 12,795,878 B2
(45) Date of Patent: Nov. 10, 2026

(54) ELECTRONICS MOUNTING SYSTEM

(71) Applicant: Apple Inc., Cupertino, CA (US)

(72) Inventors: Lee B. Hamstra, Palo Alto, CA (US); Stephanie Y. Su, Burlingame, CA (US); Richard Li, San Francisco, CA (US); Thomas O. Henry, Palos Verdes Estates, CA (US)

(73) Assignee: APPLE INC., Cupertino, CA (US)

( * ) Notice: Subject to any disclaimer, the term of this patent is extended or adjusted under 35 U.S.C. 154(b) by 858 days.

(21) Appl. No.: 18/305,230

(22) Filed: Apr. 21, 2023

(65) Prior Publication Data

US 2024/0107734 A1 Mar. 28, 2024

Related U.S. Application Data

(60) Provisional application No. 63/376,752, filed on Sep. 22, 2022.

(51) Int. Cl.

| | |
|---|---|
| ***H05K 13/00*** | (2006.01) |
| ***G03B 17/56*** | (2021.01) |
| ***H04N 23/57*** | (2023.01) |
| ***H05K 5/00*** | (2006.01) |
| ***H05K 5/02*** | (2006.01) |
| ***H05K 5/10*** | (2025.01) |

(52) U.S. Cl.
CPC ......... *H05K 13/0015* (2013.01); *G03B 17/56* (2013.01); *H04N 23/57* (2023.01); *H05K 5/0018* (2022.08); *H05K 5/0217* (2013.01); *H05K 5/0247* (2013.01); *H05K 5/10* (2025.01)

(58) Field of Classification Search
CPC .... G06F 1/1626; G06F 1/1684; G06F 1/1686; H04N 23/57; G02B 27/646; G02B 27/0075; H05K 13/0015; H05K 5/0018; H05K 5/0217; H05K 5/0247; G03B 30/00
See application file for complete search history.

(56) References Cited

U.S. PATENT DOCUMENTS

| | | | | |
|---|---|---|---|---|
| 9,134,587 | B2 * | 9/2015 | Lim | G02B 27/646 |
| 9,681,043 | B2 * | 6/2017 | Chen | G02B 27/0075 |
| 12,066,747 | B2 * | 8/2024 | Shabtay | G03B 30/00 |

* cited by examiner

*Primary Examiner* — Donghai D Nguyen
(74) *Attorney, Agent, or Firm* — Dorsey & Whitney LLP

(57) ABSTRACT

An electronic device includes a housing having a sidewall defining an internal volume, a display secured to the housing, a camera assembly disposed in the internal volume between the display and the sidewall, a spring finger biasing the camera assembly away from the sidewall, and a compression block disposed between the camera assembly and the sidewall.

7 Claims, 14 Drawing Sheets

ELECTRONICS MOUNTING SYSTEM

CROSS-REFERENCE TO RELATED APPLICATION(S)

This claims priority to U.S. Provisional Patent Application No. 63/376,752, filed 22 Sep. 2022, and entitled "ELECTRONICS MOUNTING SYSTEM," the entire disclosure of which is hereby incorporated by reference.

FIELD

The described embodiments relate generally to electronic devices. More particularly, the present embodiments relate to components and systems for lessening shifting of internal components during use.

BACKGROUND

Recent advances in portable computing have enabled compact design and increased functionality due to miniaturized electronic components. Many electronic devices include, for example, one or more sensors for detecting environments external to the device. Sensors can include cameras, which can be incorporated into electronic devices for recording and transmitting video. Many consumer electronics, including smartphones, tablets, laptop computers, and so forth, incorporate cameras into the device. Cameras and other sensors can include sensitive components that must be precisely positioned within the device or sensor assembly to work properly. For example, cameras include lenses that must be precisely positioned and maintained during use to capture focused images and video. However, because of the portable nature of such devices, user can often drop them, causing impact with the ground or other surface.

SUMMARY

In at least one example of the present disclosure, an electronic device includes a housing having a sidewall defining an internal volume, a display secured to the housing, a camera assembly disposed in the internal volume between the display and the sidewall, a spring finger biasing the camera assembly away from the sidewall, and a compression block disposed between the camera assembly and the sidewall.

In one example, the electronic device further includes a datum fixed in position relative to the housing. In one example, the camera assembly includes a carrier securing a lens, the carrier defining a stop, and the stop is positioned between the datum and the sidewall. In one example, the spring finger can further include an engagement portion, a base portion pressing against the sidewall, and a curved portion disposed between the engagement portion and the base portion. In such an example, the engagement portion contacts the camera assembly. In one example, the compression block is pre-loaded in compression between the sidewall and the camera assembly. In one example, the display is secured to the housing via a stiffener cantilevered from the sidewall. In one example, the display is adhered to the stiffener via one or more pressure sensitive adhesive strips disposed between the stiffener and the display. In one example, the electronic device further includes a spacer disposed below the stiffener to support the stiffener during assembly of the display onto the stiffener.

In at least one example of the present disclosure, a sensor retention assembly for an electronic device includes a sensor carrier, a datum pressing against the sensor carrier in a first direction and limiting a movement of the sensor carrier relative to a housing of the electronic device, a spring finger pressing the sensor carrier in a second direction against the datum, the second direction opposite the first direction, and a compression block pressing the sensor carrier in the second direction against the datum.

In one example, the spring finger includes an engagement portion contacting the sensor carrier and a base portion pressing against the housing, the housing defining an external surface and an internal volume of the electronic device. In one example, the base portion is fixed to the housing and a spring force from the spring finger maintains contact between the engagement portion and the sensor carrier. In one example, the spring finger biases the sensor carrier away from the housing. In one example, the compression block includes a first end pressing against the sensor carrier and a second end opposite the first end, the second end pressing against the housing. In one example, the compression block includes foam. In one example, the sensor retention assembly further includes a camera carried by the sensor carrier, the camera including a lens and a housing secured in position by the sensor carrier.

In at least one example of the present disclosure, an impact absorption assembly for an electronic component includes a carrier securing the electronic component in position, a datum, a spring finger pressing the carrier against the datum, the spring finger having a first spring force curve, and a compression block pressing the carrier against the datum, the compression block having a second spring force curve different than the first spring force curve.

In one example, the spring finger includes an elongate metal arm. In one example, the spring finger includes a first arm contacting the carrier and a second arm contacting the carrier, the first arm and the second arm bias the carrier toward a first datum block and a second datum block, and at least a portion of the carrier is disposed between the first datum block and the second datum block. In one example, the compression block is disposed between the first arm and the second arm. In one example, the compression block includes open cell foam.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
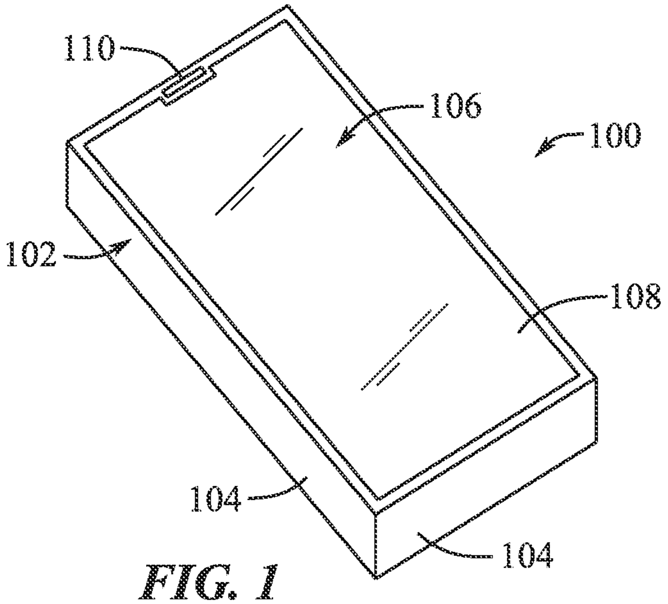
FIG. 1 shows a perspective view of an example of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to electronic devices. More particularly, the present embodiments relate to components and systems for securing internal electronics from impact forces caused by drop events. In a particular example, an electronic device can include a housing having a sidewall defining an internal volume, a display secured to the housing, a camera assembly disposed in the internal volume between the display and the sidewall, a spring finger biasing the camera assembly away from the sidewall, and a compression block disposed between the camera assembly and the sidewall. In at least one example, device can also include one or more physical datum features against which the spring finger and the compression block bias the camera assembly.

Upon impact, the compression block and the spring finger can compress to allow the camera assembly to separate from the datum. In this way, adjacent components such as the display, which may also move in response to an impact due to a drop event, do not come into contact with the camera assembly. After impact, the spring finger and/or the compression block can return the camera assembly back against the datum and into position for proper functioning.

While the sensor components and systems described herein, including the camera assembly noted above, can apply to any electronic device incorporating sensors, portable devices can be at a higher risk than others of being dropped during use. As the user walks about or transports a portable device from one place to another, the user can inadvertently drop the device. Upon impact from a dropping event, a number of components of the device can be jostled or acted upon by forces derived from the impact surface or other components bumping into one another within the device.

For example, devices can include display assembly components and sensors. If dropped, the method of fixation of each of these components as well as the weight and materials of the components themselves can affect how much each component is jostled or displaced during the impact of a drop event. In one example, the displacement in any direction of one or more of the display assemblies may be more or less than the displacement of the sensors as a reaction to the same impact. Even in situations where such components or displaced in the same or similar manner and magnitude, the direction and oscillating frequency of the movement of these components may differ such that adjacent components can physically bump into one another.

Accordingly, devices described herein can include shock absorbing sensor retention assemblies configured to absorb forces from drop events that could otherwise result in misalignment. The sensor retention assemblies of the devices described herein can include impact absorption assemblies configured to protect the sensors that could be impacted by other components within the electronic device, including display assemblies. The sensor retention assemblies can include compliant structures and components for allowing displacement of the sensor to avoid impact or displacement from adjacent components of the device.

In some examples described herein, the compliant component can include multiple sub-components maintaining a proper position of the sensor during normal use and allowing protective displacement thereof during an impact from a drop event. The multiple sub-components allowing for protective displacement of the sensor can include a spring finger configured to provide a consistent and sufficient restoring force for returning the sensor to its proper position against one or more datum features. Another sub-component of the compliant structure or component can include a compression block for absorbing and damping movement of the sensor via compression during the impact. In this way, the various components of the compliant structure of the sensor retention assembly can act together for different purposed to enhance the protection and positional restoration of the sensor during and after an impact.

These and other embodiments are discussed below with reference to FIGS. 1-12. However, those skilled in the art will readily appreciate that the detailed description given herein with respect to these figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 1 illustrates an example of an electronic device 100 including a housing 102 defining a sidewall 104. In at least one example, the housing 102 defines an external surface and an internal volume of the electronic device 100. In at least one example, the sidewall 104 can extend circumferentially around a display assembly 106. The display assembly 106 can include an outer transparent layer or cover 108. In addition, in at least one example, the electronic device 100 can include a sensor 110. The sensor 110 can be disposed in an internal volume defined by the housing 102, and can communicate with an external environment through an aperture or transparent portion of the display assembly 106 and/or the housing 102.

The illustrated example of the electronic device 100 shown in FIG. 1 can include a mobile computing device such as a smartphone or a tablet computer. Other electronic devices are also contemplated herein, including smart watches, head mountable display devices, or any other electronic device commonly used and carried by users. In at least one example, the sensor 110 can include multiple components within an internal volume of the electronic device 100. The display assembly 106 can also include multiple components including the outer transparent cover 108 as well as internal display layers and electronic components. The portable electronic devices described herein, such as that shown in FIG. 1, can be compact in design and configured to be portable such that the user can transport the electronic device 100 in his or her pocket, carry it in his or her hands, and/or transport the electronic device 100 as needed.

Figure 2:
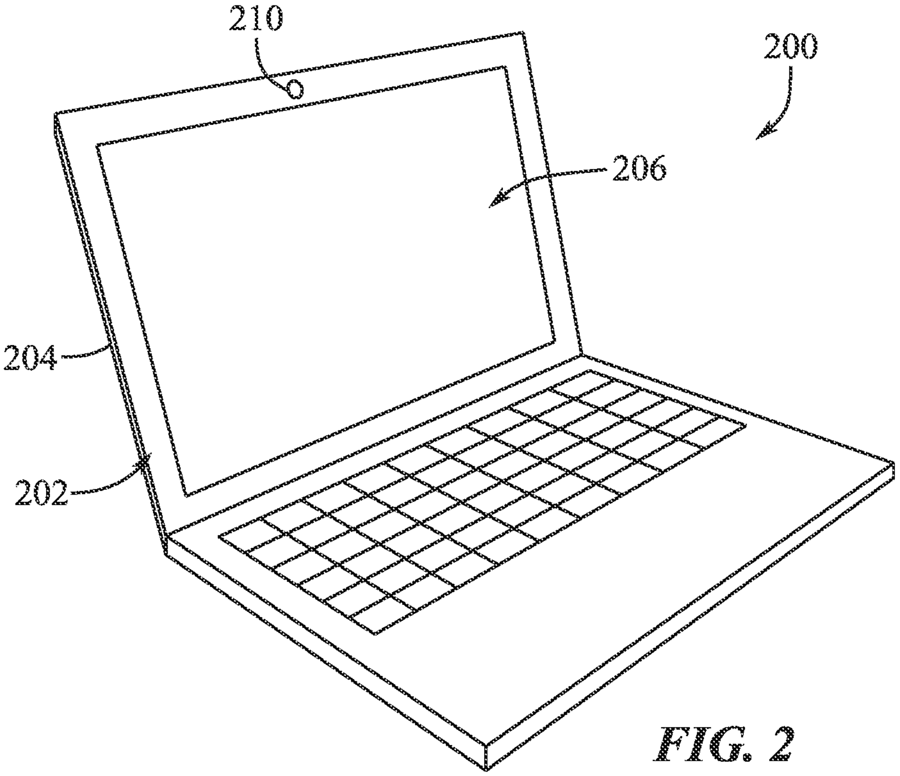
FIG. 2 shows a perspective view of another example of an electronic device.

Along these lines, FIG. 2 illustrates another example of an electronic device 200, including a laptop computer having a housing 202 defining a sidewall 204. The electronic device 200 can also include a display assembly 206 and a sensor 210 disposed at least partially within an internal volume defined by the housing 202 and configured to communicate with an external environment through an aperture or transparent portion. The electronic device 200 of FIG. 2 can also be a portable laptop computer configured to be carried about, placed in different environments, and moved during use.

The devices 100, 200 shown in FIGS. 1 and 2, respectively, include one or more sensor retention assemblies configured to absorb forces due to impacts resulting from drop events. The sensor retention assemblies of the devices described herein, including the devices 100 and 200, can include impact absorption assemblies configured to protect the sensors 110, 210 from impact by other components within the electronic device 100, 200, including the display assemblies 106, 206 and any subcomponents thereof.

The illustrated examples of devices 110 and 210 can include cameras to detect light. The sensors 110, 210 can include sensitive components such as lenses and light receivers which should maintain precise position and orientation for the camera to operate effectively. Other sensors can include time-of-flight sensors, environmental sensors including liquid and humidity sensors, or any other sensor, all of which can include sensitive and precisely aligned components. Electronic components other than sensors 110, 210 can also include shock absorbing retention features configured to protect the component in the event of a drop impact. The sensors are described herein as exemplary components and are not meant to be limiting.

In examples of electronic devices described herein, including those shown in FIGS. 1 and 2, any number of sensors, display components, or other components that can be impacted in a drop event can be included in the devices. Any one of these components, including electronic components and structural components other than sensors and sensor assemblies, can include shock absorbent assemblies described herein. That is, while the sensors shown throughout the present disclosure include shock absorbent retention assemblies as a matter of example, those same shock absorbent and retention assemblies can be included with or applied to any component within an electronic device in need of protection from drop events and damaging impacts.

Any of the features, components, and/or parts, including the arrangements and configurations thereof shown in FIGS. 1 and 2 can be included, either alone or in any combination, in any of the other examples of devices, features, components, and parts shown in the other figures. Likewise, any of the features, components, and/or parts, including the arrangements and configurations thereof shown in the other figures can be included, either alone or in any combination, in the example of the devices, features, components, and parts shown in FIGS. 1 and 2.

Figure 3:
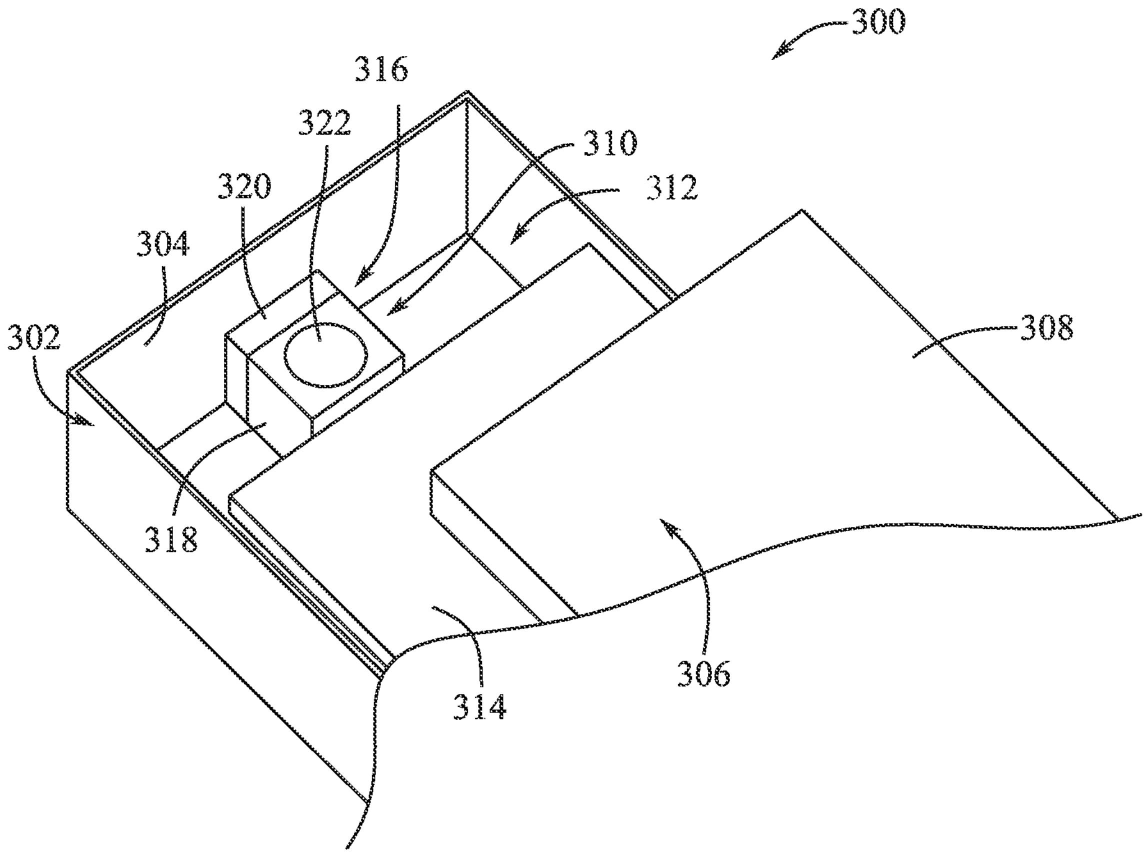
FIG. 3 shows a partial exploded view of a portion of an example of an electronic device including a display, a sensor, and a sensor securement assembly.

FIG. 3 illustrates another example of an electronic device 300 including a sensor retention assembly 316 configured to absorb forces and prevent the sensor 310 from deflecting into or contacting the display assembly 306. In particular, the device 300 can include a sensor 310 including a lens 322. In one example, the sensor 310 can include a camera and the lens 322 can be a camera lens. The sensor retention assembly 316 can include a carrier 318 configured to house components of the sensor 310, including the lens 322. The sensor retention assembly 316 can also include a compliant structure or subassembly 320 engaging the carrier 318.

The device 300 can include a housing 302 defining an internal volume 312 in which the sensor 310 and the sensor retention assembly 316 are disposed. In at least one example, the housing 302 can include one or more sidewalls 304 defining the internal volume 312. FIG. 3 shows an exploded view of the device 300 including an exploded view of the display assembly 306. In at least one example, the display assembly 306 can include an outer transparent cover 308 and a display stack 314. The display stack 314 can include a number of other layers or subcomponents of the display assembly 306, including light emitting layers, touch sensitive layers, electrical flexes and wiring, or any other component functioning as part of the display assembly 306 of the device 300.

As shown in the example of FIG. 3, one or more portions of the display assembly 306 can be disposed within the internal volume 312. For example, the display stack 314 can be disposed in the internal volume 312 as shown. In at least one example, the display stack 314 and the sensor 310 can be disposed adjacent or close to one another. As noted above, in the event of a drop or impact of the device 300 during use, the sensor retention assembly 316 can include a shock absorbent assembly configured to allow the sensor 310 to move out of the way of the display stack 314 in cases where the display stack 314 moves in response to a drop event or impact. In this way, rather than colliding with each other, the sensor 310 can avoid contact with the display stack 314 during a drop event, which could otherwise, in some other devices, impact the sensor 310 and/or the display stack 314.

In particular, in at least one example as shown in FIG. 3, the sensor retention assembly 316 can include a compliant structure 320 engaging the carrier 318 of the sensor 310. A compliant structure 320 can be compressed or elastically deformed such that, during normal use, the compliant structure 320 maintains a position of the carrier 318 and thus the sensor 310 including the lens 322 or any other sensitive components thereof. During a drop event resulting in an impact, the compliant structure 320 can elastically deform to allow the carrier 318, and thus the sensor 310, to move out of the way of the display stack 314, which may also be jostled during the drop event. In this way, the compliant structure 320 and the carrier 318 of the sensor retention assembly 316 can protect the sensor 310 from impact.

Any of the features, components, and/or parts, including the arrangements and configurations thereof shown in FIG. 3 can be included, either alone or in any combination, in any of the other examples of devices, features, components, and parts shown in the other figures. Likewise, any of the features, components, and/or parts, including the arrangements and configurations thereof shown in the other figures can be included, either alone or in any combination, in the example of the devices, features, components, and parts shown in FIG. 3.

Figure 4A:
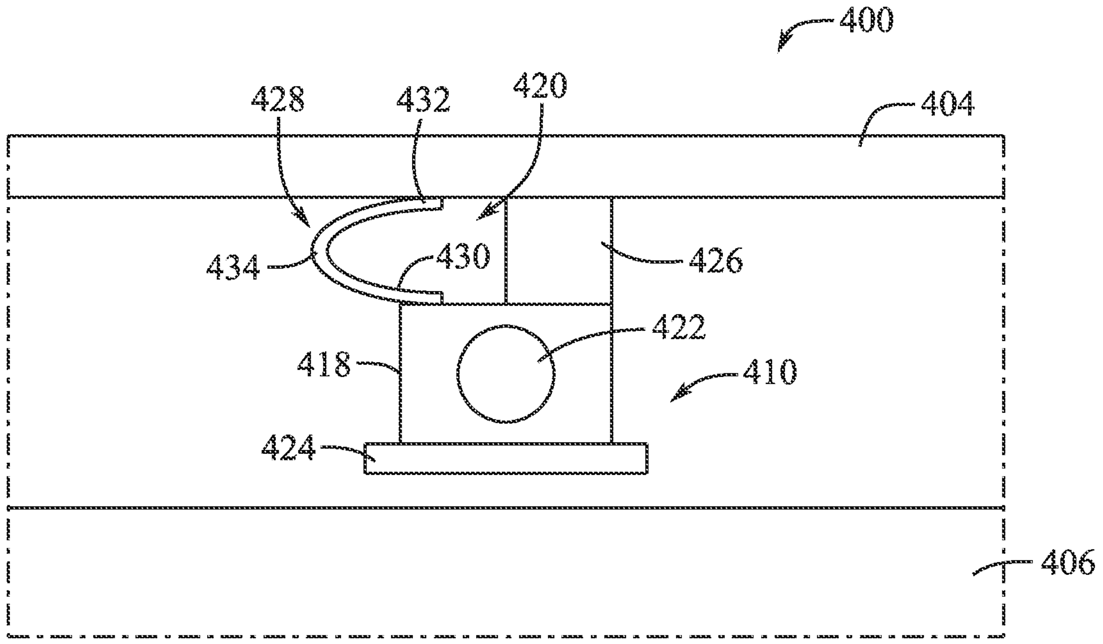
FIG. 4A shows a partial top view of a portion of an example of an electronic device including a display, a sensor, and a sensor securement assembly.

FIG. 4A illustrates a partial plan view of another example of an electronic device 400 including a housing sidewall 404, the display assembly 406, a sensor 410, and a compliant structure 420. The display assembly 406 can be secured to the housing sidewall 404 via various connectors not shown in FIG. 4A. In at least one example, the sensor 410 can include a camera assembly having a lens 422. A carrier 418 can act as a housing to secure the sensor 410 between a datum 424 and the compliant structure 420. In at least one example, the datum 424 can be a physical protrusion or block fixed in position relative to the sidewall 404 of the device 400. The sensor 410 can be disposed between the sidewall 404 and the display 406 shown in FIG. 4A.

In at least one example, the complaint structure 420 can include a spring finger 428 and a compression block 426, both of which can be disposed between the carrier 418 and the sidewall 404. Both the spring finger 428 and the compression block 426 can be configured to urge or bias the carrier 418, and thus the sensor 410, against the datum 424. In this way, during normal use without the occurrence of a drop event or impacts, the sensor 410 can be held in position against a reference point provided by the datum 424. In at least one example, the spring finger 428 can include an engagement portion 430 contacting the carrier 418 and a base portion 432 pressing against the sidewall 404. A curved portion 434 disposed between the engagement portion 430 and the base portion 432 can provide a spring force biasing the engagement portion 430 away from the base portion 432 when the spring finger is compressed such that the engagement portion 430 is moved toward the base portion 432.

One in at least one example, the base portion 432 is fixed to the sidewall 404 via an adhesive or other bonding mechanism while the engagement portion 430 is free of affixation to the carrier 418 or any other component of the sensor 410. In at least one example, the base portion 432 is also free of affixation to the sidewall 404 but frictional forces between the base portion 432 and the sidewall 404, as well as frictional forces between the engagement portion 430 and the carrier 418, maintain the spring finger 428 in position as shown in FIG. 4A. In at least one example, the engagement portion 430 of the spring finger 428 is bonded or otherwise affixed to the carrier 418 and the base portion 432 is free of affixation to the sidewall 404. In at least one example, both the base portion 432 and the engagement portion 430 are fixed to the sidewall 404 and the carrier 418, respectively.

In at least one example, the compression block 426 includes a compressible foam material. In at least one example, the foam material can include an open cell foam material. In at least one example, the compression block 426 is disposed between the carrier 418 and the sidewall 404 in compression. In this way, the compression block 426 can be preloaded to apply a biasing force urging the carrier 418 and thus the sensor 410 against the datum 424. The compression block 426 can also be preloaded in compression to target an optimal absorption of a specific range of forces due to accelerations to provide protection to the sensor 410. In at least one example, the compression block is not preloaded but is assembled within the device 400 with as little preload compression as possible. In at least one example, the compression block 426 is pressed or fixed to either the sidewall 404 and/or the base portion 432 of the spring finger 428 or the carrier 418 but not both. In such an example, the compression block may not initially contact the carrier 418 on one end or the housing sidewall 404 or spring finger 428 at the other end, but would contact at both sides/ends when the carrier 418 displaces toward the compression block 426 in the event of an impact from a drop.

In at least one example, the carrier 418 or other components or subcomponents of the sensor 410, including other housings or support structures, are free of affixation to the datum 424. Rather, in at least one example, frictional forces between the carrier 418 and the datum 424 caused by a force provided by the compliant structure 420 against the carrier 418 maintain the position of the carrier 418 relative to the datum 424 as shown in FIG. 4A.

Figure 4B:
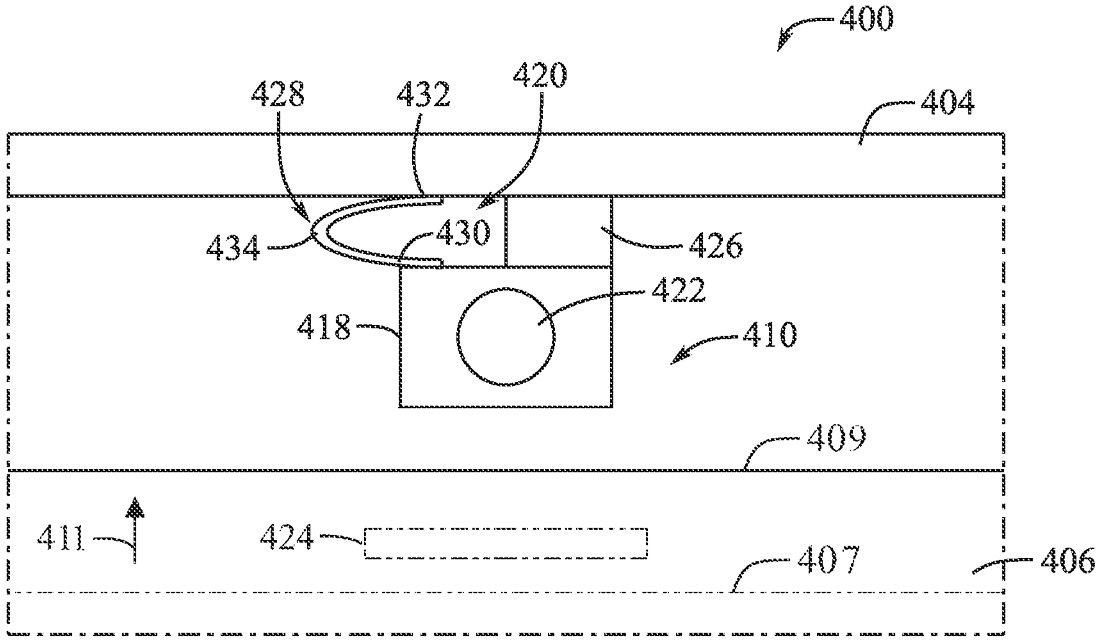
FIG. 4B shows another top view thereof during a drop event or impact.

FIG. 4B illustrates the device 400 during an impact caused by a drop event. In such an event, the forces of resulting from the impact may cause the display 406 to translate or move as indicated by the arrow 411 from a first position 407 to a second position 409. The second position 409 can include an edge of the display 406 extending beyond the datum 424. FIG. 4B also shows the complaint structure 420 compressing to allow the sensor 410 and the carrier 418 supporting the sensor 410 and the lens 422 to deflect when the display 406 moves as shown. In this way, no contact is made between the sensor 410 and the display 406. As shown, the spring finger 428 can compress to allow the sensor 410 to move out of the way of the display 406 and the compression block 426 can also further compress to allow a protective movement of the sensor 410.

In at least one example, both the spring finger 428 and the compression block 426 can be elastically compressible such that after the drop event, including after or during when the display 406 returns from the second position 409 to the first position 407, the spring finger 428 and the compression block 426 can be configured to provide a restorative force on the carrier 418 and the sensor 410 to return the sensor 410 back into position against the datum 424 as shown in FIG. 4A. In this way, after the drop event, not only is impact to the sensor from collision with the display 406 avoided, but the sensor 410 is return to its original position to function properly as intended.

In at least one example, the compression block 426, which as noted above can include foam or open cell foam material, can include properties that react well to high accelerations during a drop event and impact. In at least one example, the open cell foam material can provide a damping effect to the deflection of the sensor 410, especially when impact forces cause the sensor 410 to oscillate. Such an oscillation may be more pronounced with only the presence of the spring finger 428 such that the spring finger 428 and the compression block 416 are configured to operate together to minimize impact to the sensor 410. The compression block 426 can thus act as a shock absorber of forces passing through the device 400 including forces passing through the housing or sidewall 404 thereof, through the carrier 418, and to the sensor 410. The material of the compression block 426, including foams or other compressible material such as polymers, rubbers, or other compressible materials, can be chosen or designed to manage certain ranges or magnitudes of these forces and accelerations experienced during drop events and impacts.

The spring finger 428 can include an elongate plastic or metal material forming spring arms to elastically return to shape as shown in FIG. 4A. The spring finger 428 can thus be advantageous to provide the return force noted above, which may not be provided by the compression block 426 alone, as the compression block can be optimally designed for absorption of forces and damping of movements due to high accelerations at impact. In at least one example, the spring can be designed to the load before the compression block 426 loads or compresses at accelerations less than a certain threshold. After the threshold is exceeded, the compression block can then be loaded. In at least one example, the threshold can include between accelerations between about 5 and 20 G-forces, for example between about 8 and 12 G-forces, or about 10 G-forces.

In this way, the compression block 426 and the spring finger 428 work together to provide both high absorption at impact and consistent return forces after impact. In at least one example, the compliant structure 420, including the spring finger 428 and the compression block 426, can be configured to absorb forces from accelerations in one direction, as shown in FIGS. 4A and 4B, to avoid colliding with the display 406 deflecting in that same direction. One or more other examples can include other retention and impact absorbing assemblies similar to the compliant structure 420 shown in the figures on any side of the sensor 410 to likewise protect the sensor 410 from colliding with other components disposed on those other sides during a drop event or impact.

Any of the features, components, and/or parts, including the arrangements and configurations thereof shown in FIGS. 4A and 4B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 4A and 4B.

Figure 5A:
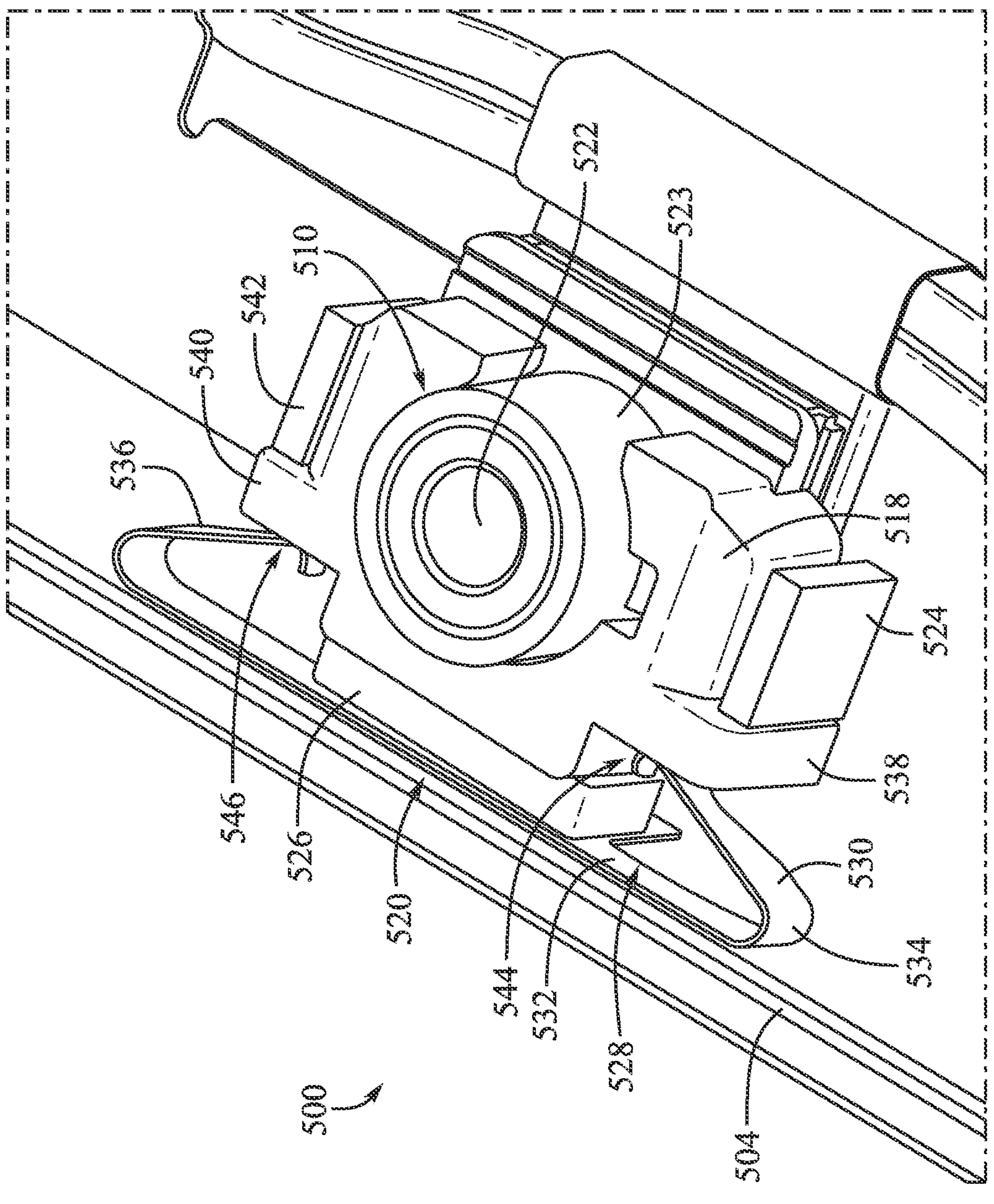
FIG. 5A shows a partial perspective view of an example of a device including a sensor and a sensor securement assembly.
Figure 5B:
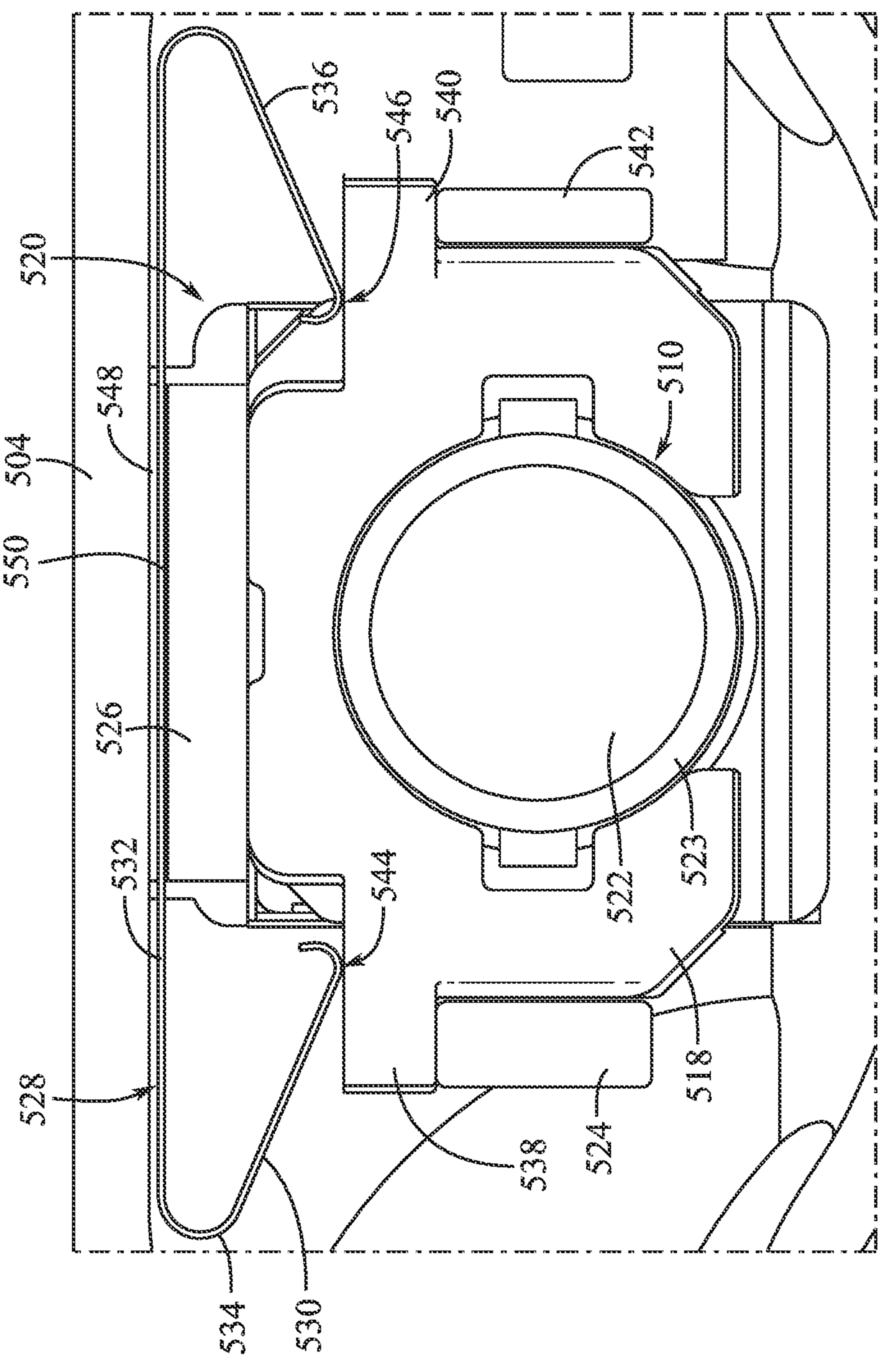
FIG. 5B shows a top view an example of a device including a sensor and a sensor securement assembly.
Figure 5C:
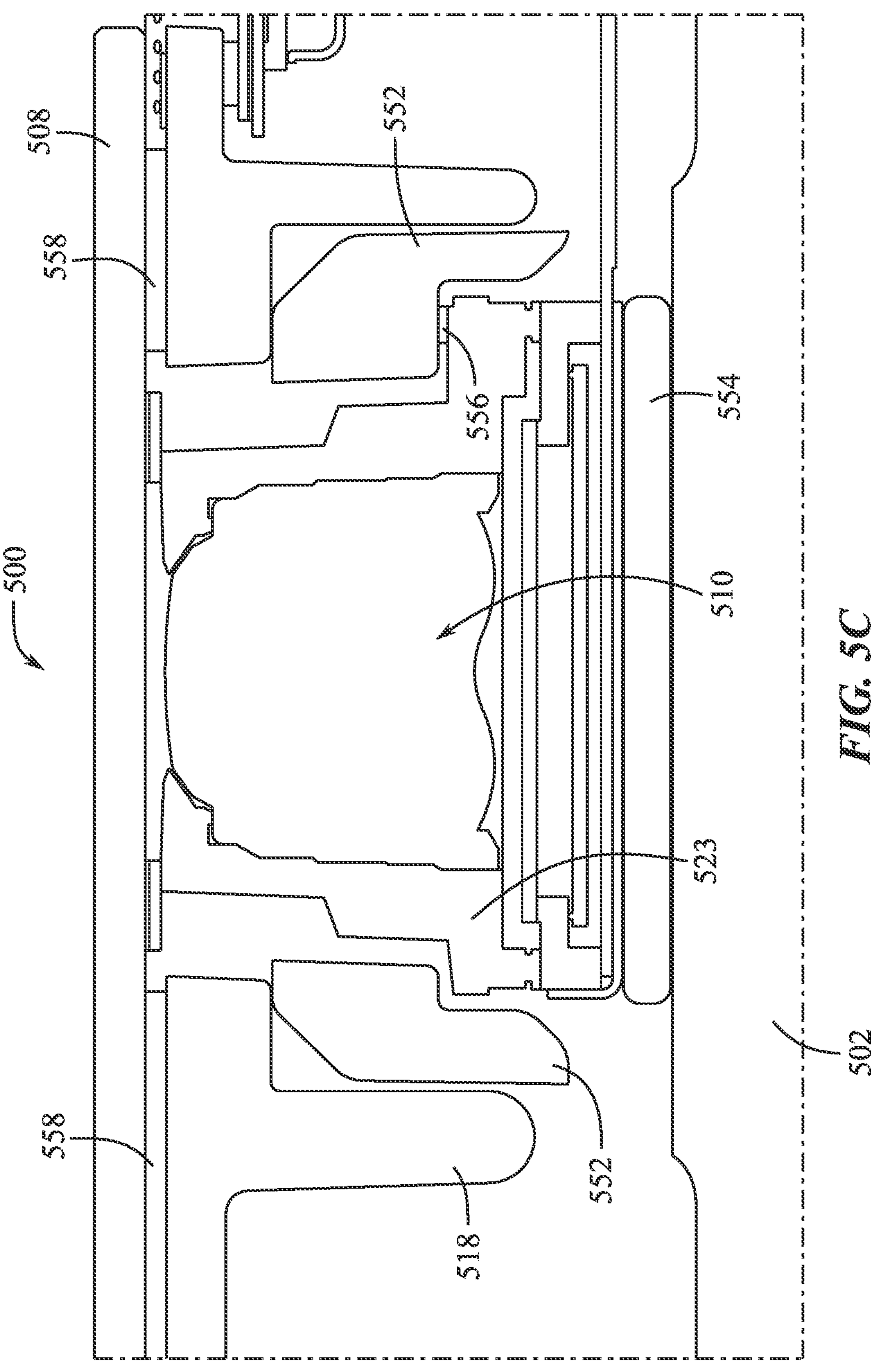
FIG. 5C shows a front view an example of a device including a sensor and a sensor securement assembly.

FIGS. 5A, 5B, and 5C illustrates perspective, top, and front views, respectively, of an example of a sensor retention assembly for an electronic device 500 including a sensor 510. The sensor 510 can be a camera having a lens 522 and a housing 523 securing the lens 522. A retention assembly can include a compliant structure 520 or assembly including a spring finger 528 and a compression block 526. In addition, the assembly can include a carrier 518 disposed at least partially around the housing 523 of the camera sensor 510 to secure the housing 523 in position relative to datum blocks 524 and 542. The datum blocks 524 and 542 can also be referred to herein as datums 524 and 542. The carrier can absorb and transfer forces from the housing sidewall 504 and through the compliant structure 520 to the datums 524 and 542. In this way, the carrier 518 can protect the housing 523 and other components of a sensor 510 by preventing forces from passing through.

As noted above, the datums 524 and 542 can limit a movement of the carrier 518 in a first direction relative to the housing sidewall 504. The complaint structure 520 can include the spring finger 528 pressing the carrier 518 in a second direction opposite the first direction against the datums 524 and 542. The compliant structure 520 can also include a compression block 526 disposed between carrier 518 and the housing sidewall 504 to press the carrier 518 in the second direction against the datums 524 and 542.

In at least one example, the spring finger 528 can include a base portion 532 connected to an engagement portion 530 via a curved portion 534 providing a spring biasing force separating the base portion 532 from the engagement portion 530 contacting the carrier 518. In at least one example, the engagement portion 530 is preloaded in compression relative to the base portion 532. In at least one example, the engagement portion 530 is not initially in a compressed or preloaded configuration relative to the base portion 532 but is only compressed or loaded upon impact and forces due to acceleration of the carrier 518 pressing the engagement portion 530 toward the base portion 532. As noted above, in at least one example the engagement portion 530 may not be fixed or bonded to the carrier 518, but frictionally engages the carrier 518 at a first engagement site 544.

In at least one example, the spring finger 528 includes a second engagement portion 536 pressing against, or configured to press against, the carrier 518 at a second engagement site 546. In such an example, the compression block 526 can be disposed between the carrier 518 and the base portion 532 of the spring finger 528 with either engagement portion 530, 536 disposed at least partially on either side of the compression block 526. In this way, in at least one example, the compliant structure 520, including the spring finger 528 and the compression block 526 shown in FIGS. 5A and 5B, can press on the carrier 518 on either side of the sensor 510 to urge the carrier 518 against both datums 524 and 542 positioned on either side of the sensor 510. In such an example, the spring finger 528 can include a first engagement portion 530 forming an arm or spring extension pressing on one side of the carrier 518 and a second engagement portion 536 and forming a second arm or spring extension pressing on an outer side of the carrier 518. In at least one example, the carrier 518 can secure the lens 522 of the sensor 510 in position.

The carrier 518 can include or define a first stop feature 538 and the second stop feature 540. The stop features 538, 540 can be configured to extend outward to make contact with the datums 524 and 542, respectively, as shown in FIGS. 5A and 5B. One or more other surfaces or features of the carrier 518 can be configured to contact or press against one or more of the datums 524, 542 of the electronic device 500. As shown in FIGS. 5A and 5B, the stops 538 and 540 can be positioned between the datums 524 and 542, respectively, and the housing sidewall 504.

In at least one example, the spring finger 528 is configured to bias the carrier 518 away from the housing sidewall 504. In addition, the compression block 526 can include a first end or side pressing against the carrier 518 and a second end or side opposite the first end. The second end of the compression block 526 can press against the housing sidewall 504 either directly or press against the base portion 532 of the spring finger 528 shown in the example illustrated in FIGS. 5A-C.

In at least one example, the compression block 526 can be free-floating between the carrier 518 and the housing sidewall 504 or the base portion 532 of the spring finger 528. In at least one example, the compression block 526 can be adhered to the sidewall 504 or the base portion 532 of the spring finger 528 via an adhesive layer 550 bonding the compression block 526 thereto. In at least one example, a surface of the compression block 526 engaging the carrier 518 can also be bonded or adhered thereto. Likewise, the spring finger 528 can be adhered or bonded to the sidewall 504 via an adhesive layer 548.

As noted above with reference to other examples of spring fingers and compression blocks, the spring finger 528 shown in FIGS. 5A and 5B can produce a spring or biasing force having a first spring constant biasing the carrier 518 away from the sidewall 504 and toward the datums 524 and 542. Likewise, the compression block 526 can include or define a biasing force having another spring constant causing the carrier 518 to be biased away from the sidewall 504 and towards the datums 524 and 542. As noted above, the spring finger 528 and the compression block 526 can be designed or configured to have different reactions to forces acting thereon. For example, the spring force curve of the spring finger 528 can be different than the spring force curve of the compression block 526. The term "spring force curve," as used herein, can refer to a magnitude of the biasing force vs. a magnitude of compression of the spring finger 528 and/or the compression block 526. As noted above, the spring force curve of both the spring finger 528 and the compression block 526 can be different and designed or adapted to provide different spring constants or biasing forces in reaction to different magnitudes of forces and accelerations from the carrier 518 during a drop event or impact. In this way, as noted above, the compression block 526 can provide cushioning and damping advantages to the sensor 510 while the spring finger 528 provides consistent and sufficient restoring forces.

The front view of FIG. 5C illustrates a support foam 554 disposed between the sensor 510 and the housing 502 of the electronic device 500. The front view of FIG. 5C also shows a cover glass 508 disposed above the sensor 510. In at least one example, the support foam 554 is not secured to the housing 502 but is in preload to push the sensor 510 upward to sit correctly in alignment with the other components and datums 524, 542 illustrated in FIGS. 5A and 5B. In addition, the front view of FIG. 5C illustrates a rotation feature 552 surrounding or at least partially surrounding the housing 523 of the sensor 510 between the housing 523 and the carrier 518. The rotation feature 552 can be secured to the housing 523 of the sensor 510 via an adhesive layer 556. In addition, an adhesive layer 558 can bond the cover glass 508 to the carrier 518 as shown.

Any of the features, components, and/or parts, including the arrangements and configurations thereof shown in FIGS. 5A-5C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 5A-5C.

Figure 6:
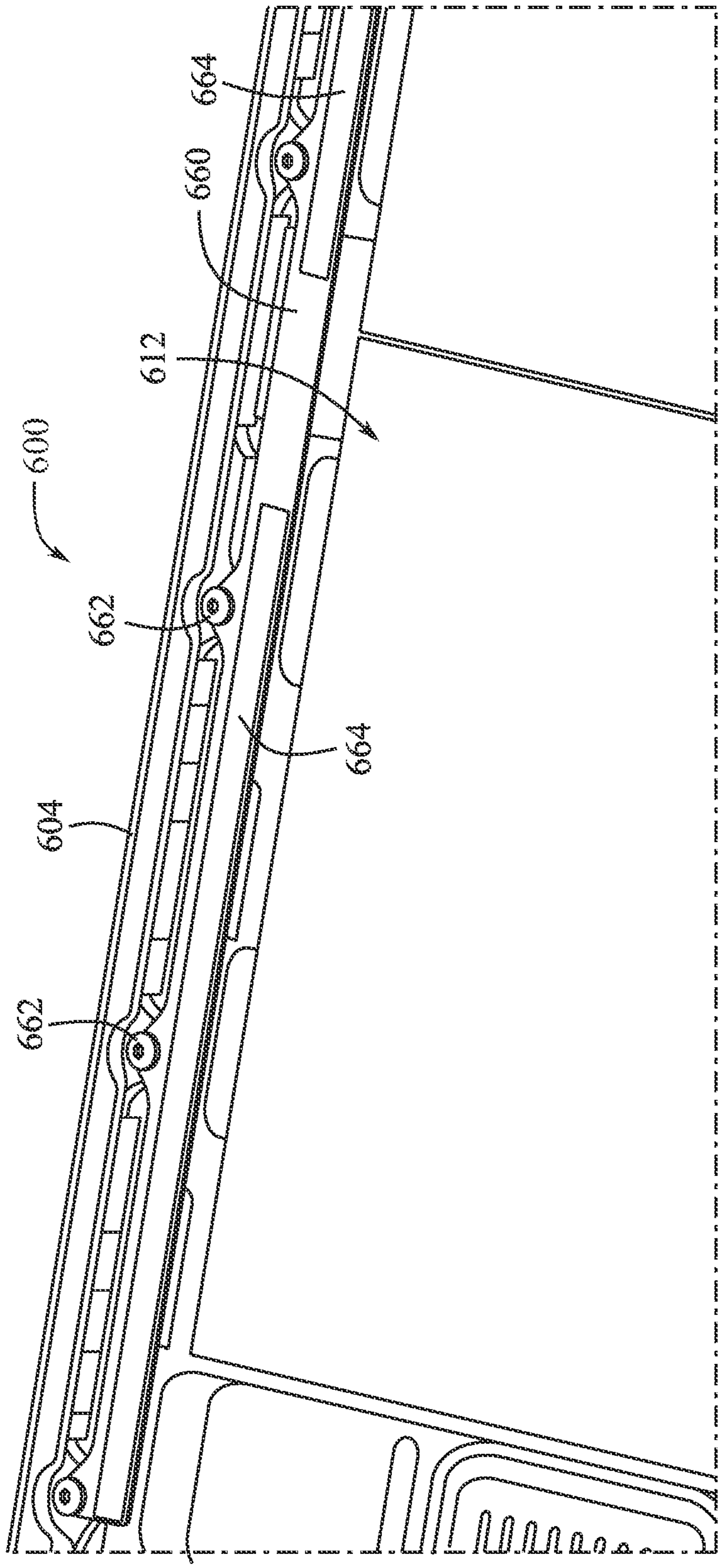
FIG. 6 shows a partial perspective view of an example of an electronic device including a stiffener.

FIG. 6 illustrates another example of the electronic device 600 including a housing sidewall 604 defining an internal volume 612. In the illustrated example of FIG. 6, the display assembly is removed to illustrate the internal volume 612. As shown, in at least one example, the electronic device 600 can include a display stiffener 660. The display stiffener 660 can be fastened to one or more shelves of the sidewall 604 via fasteners 662. The display stiffener 660 can be cantilevered to extend from the sidewall 604 where the fasteners 662 secure the stiffener 660 to the sidewall 604. In at least one example, the stiffener 660 can include one or more adhesives strips 664.

In at least one example, a portion of a display assembly shown in other figures can be pressed against strips 664 on the underside of the display assembly to secure the display assembly to the stiffener 660. In such an example, the stiffener 660 can structurally support and stiffen/strengthen the display assembly. In at least one example, the stiffener 660 is formed of a stiff material such as plastic or metal materials. Other materials can also be used in forming the stiffener 660 to provide structural support to the display assembly. In at least one example, the stiffener 660 is disposed on one end or portion of the device 600 to support one side of the display assembly.

In at least one example, other components of the device 600 can be disposed against or near the inside surface of the sidewall 604. In order to accommodate these other components along the sidewall 604, the stiffener 660 can be fastened to the sidewall 604 via fasteners 662 such that the other components adjacent to or against the inner surface of the sidewall 604 are disposed between the fasteners 662 of the stiffener 660. In at least one example, these other components can include buttons, electrical contacts or wiring, antennas, magnets, or any other component of the electronic device 600.

Any of the features, components, and/or parts, including the arrangements and configurations thereof shown in FIG. 6 can be included, either alone or in any combination, in any of the other examples of devices, features, components, and parts shown in the other figures. Likewise, any of the features, components, and/or parts, including the arrangements and configurations thereof shown in the other figures can be included, either alone or in any combination, in the example of the devices, features, components, and parts shown in FIG. 6.

Figure 7:
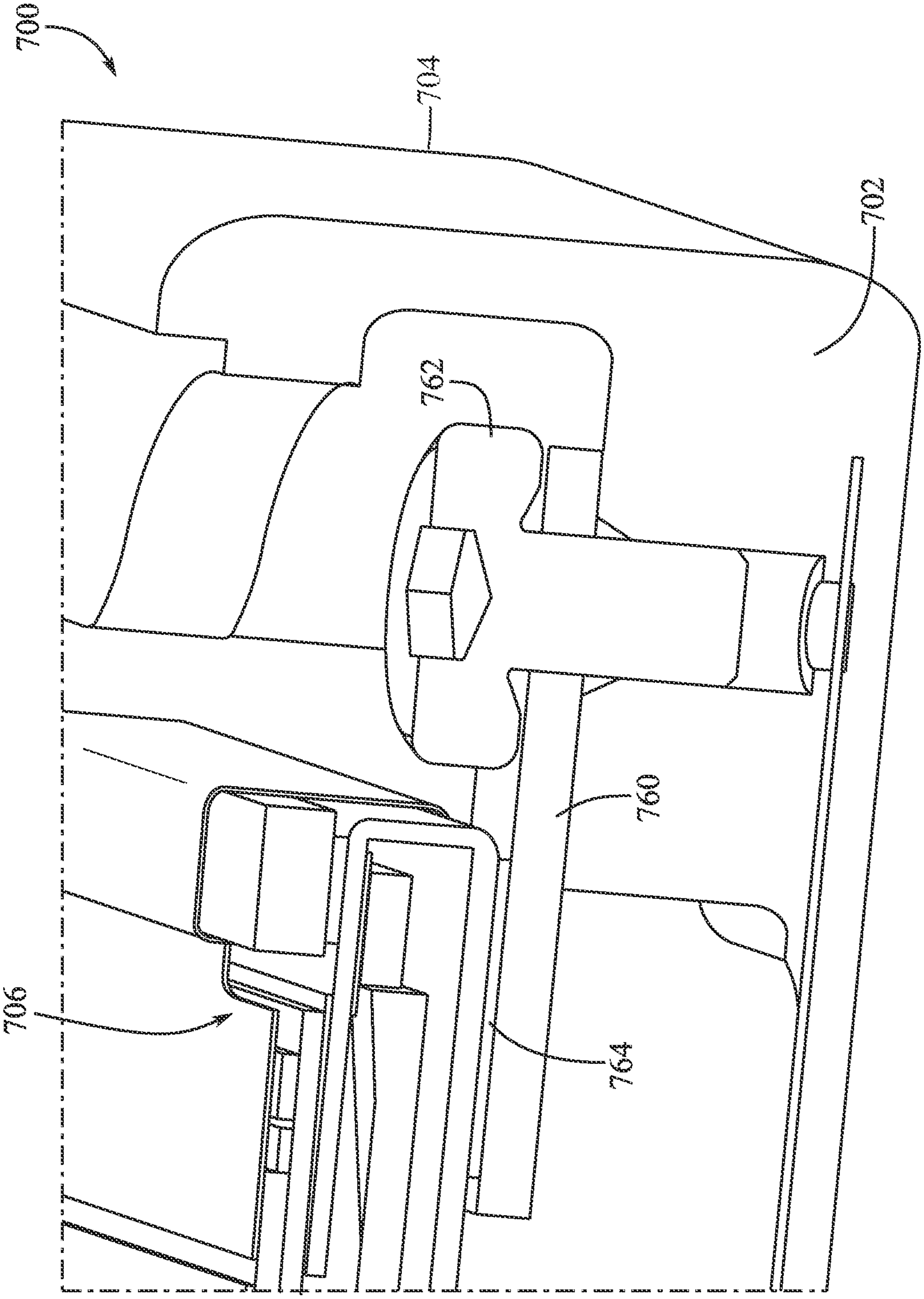
FIG. 7 shows a partial perspective view of an example of an electronic device including a stiffener fastened to the housing via a fastener.

FIG. 7 illustrates a partial cutaway view of another example of an electronic device 700 including a display assembly 706 secured to a stiffener 760. Adhesives strips 764 are disposed between the display assembly 706 and the stiffener 760 to secure the display assembly 706 to the stiffener 760. As shown, the stiffener 760 can be secured to a shelf of the sidewall 704 of the housing 702 via a fastener 762 such that the stiffener 760 is cantilevered away from the sidewall 704.

In at least one example, the fastener 762 can extend through a through hole of the stiffener 760 and threadably engage a threaded recess in the housing 702. The fastener 762 can press the stiffener 760 between the head of the fastener and the housing 702, as shown in FIG. 7. The sidewall of the housing 702 can include shelf defined by a recessed cavity. The shelf can provide a surface on which a tab or other portion of the stiffener 760 can be secured via the fastener 762.

Any of the features, components, and/or parts, including the arrangements and configurations thereof shown in FIG. 7 can be included, either alone or in any combination, in any of the other examples of devices, features, components, and parts shown in the other figures. Likewise, any of the features, components, and/or parts, including the arrangements and configurations thereof shown in the other figures can be included, either alone or in any combination, in the example of the devices, features, components, and parts shown in FIG. 7.

Figure 8:
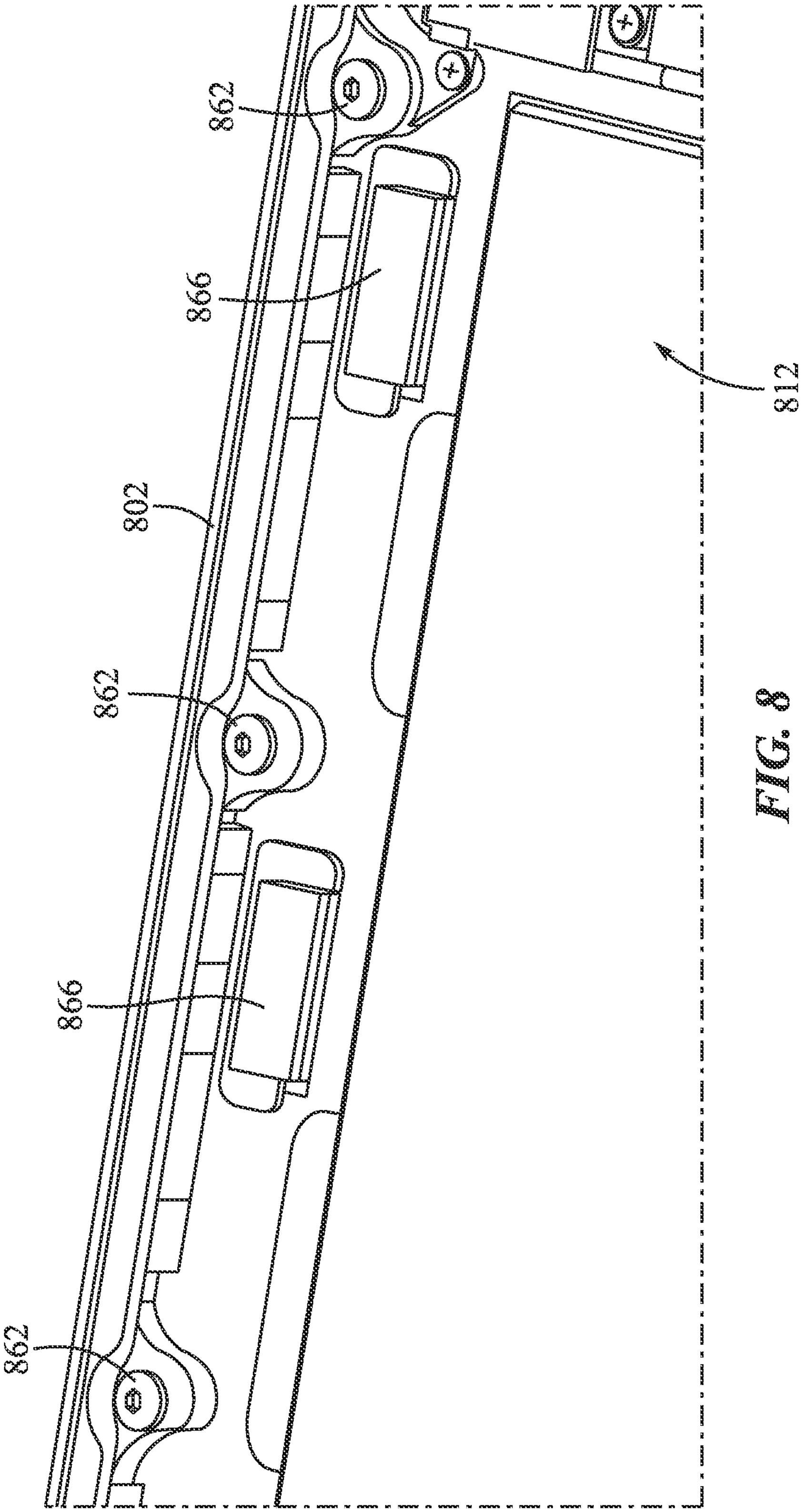
FIG. 8 shows a partial perspective view of an example of an electronic device including spacers.

FIG. 8 illustrates another example of an electronic device similar to that shown in FIG. 6 but with stiffener 660 removed to illustrate components underneath the stiffener 660. In the illustrated example, one or more spacers 860 can support the stiffener from below. The spacers 866 can be secured to a lower portion of the housing 802 and extend upward therefrom. During assembly, the display assembly can be pressed against the stiffener, which can be cantilevered from the positions of the fasteners 862, to activate the adhesives strips of the stiffener to adhere the stiffener to the display assembly. Because the stiffener is cantilevered outward from the housing sidewall, as shown in FIGS. 6 and 7, pressing downward onto the stiffener to activate the adhesives strips presses the stiffener down onto the spacers 866. In such an example, the spacers prevent the stiffener from deflecting downward during assembly when the display is pressed against the stiffener. In this way, the spacers 866 surface support the stiffener during and after assembly of the device.

Any of the features, components, and/or parts, including the arrangements and configurations thereof shown in FIG. 8 can be included, either alone or in any combination, in any of the other examples of devices, features, components, and parts shown in the other figures. Likewise, any of the features, components, and/or parts, including the arrangements and configurations thereof shown in the other figures can be included, either alone or in any combination, in the example of the devices, features, components, and parts shown in FIG. 8.

Figure 9:
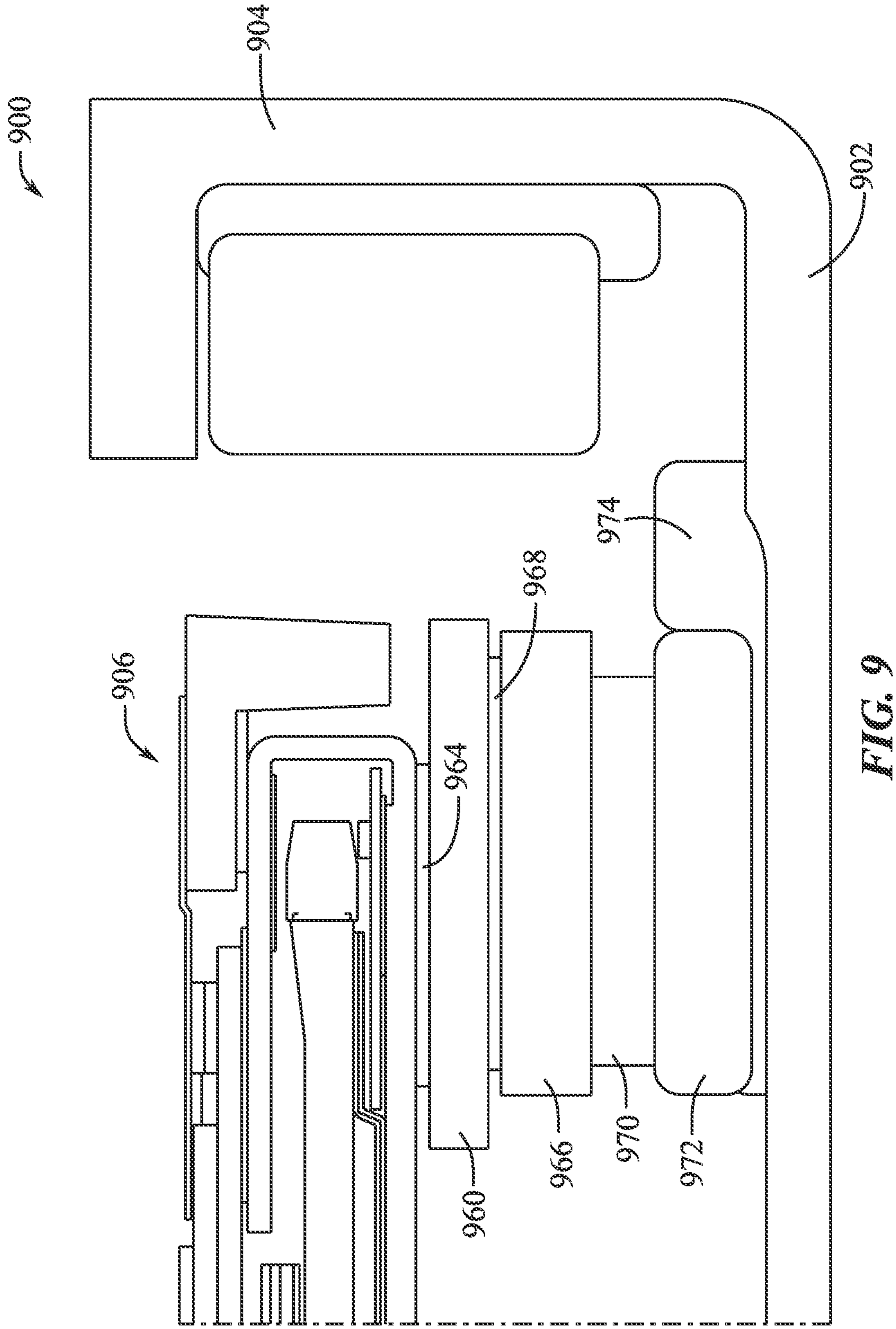
FIG. 9 shows a partial cross-sectional view of an example of electronic device including a display stiffener and spacers.

FIG. 9 illustrates a partial cutaway view of an electronic device 900 including a housing 902 defining a sidewall 904. A display assembly 906 can be secured to a stiffener 960 via an adhesive strip 964. The spacer 966 can support the stiffener 960 from below and be secured to the stiffener 960 via a low tack adhesive layer 968. The spacer 966 can be fixed in position and supported by the housing 902 via one or more other components disposed there between. In one example, the spacer 966 is secured to another component 972 via a gap fill adhesive layer 970. The gap fill adhesive layer 970 can include gap fill glue or other adhesive material. The component 972 can be secured to the housing via another adhesive layer 974. The component 972 can be any component within the electronic device 900 including a magnetic assembly, electronic components, structural components, or any other component therein.

In at least one example, the low tack adhesive layer 968 is referred to herein as "low tack" to indicate and adhesion strength relative to the adhesive strip 964. That is, a lower force is required to separate the stiffener 960 from the low tack adhesive 968 than is required to separate the display assembly 906 from the stiffener 960 adhered by the adhesive strip 964. In at least one example, the force required to separate the display assembly 906 from the stiffener 962 to the adhesive strip 964 is at least 50% more than the force required to remove the stiffener 960 from the spacer 966 due to the low tack adhesive 968. In at least one example, the force required to separate the display assembly 906 from the stiffener 960 is at least two times the force required to separate the stiffener 960 from the spacer 966. In at least one example, the force required to separate the display assembly 906 from the stiffener 960 is at least three times the force required to separate the stiffener 960 from the spacer 966.

Accordingly, when removing the display assembly 906 from the electronic device 900 during repair, a technician can ensure that the stiffener 960 remains with the display assembly 906 and the spacer 966 remains with the electronic device 900. In this way, when reassembling the display assembly 906 and stiffener 960 into the device 900, the spacer 966 remains in position ready to receive the stiffener 960 at the same position. In this way, the spacer 966 can act as a reference datum when reassembling the display assembly 906 and the stiffener 960 after repair and during reassembly.

Any of the features, components, and/or parts, including the arrangements and configurations thereof shown in FIG. 9 can be included, either alone or in any combination, in any of the other examples of devices, features, components, and parts shown in the other figures. Likewise, any of the features, components, and/or parts, including the arrangements and configurations thereof shown in the other figures can be included, either alone or in any combination, in the example of the devices, features, components, and parts shown in FIG. 9.

Figure 10:
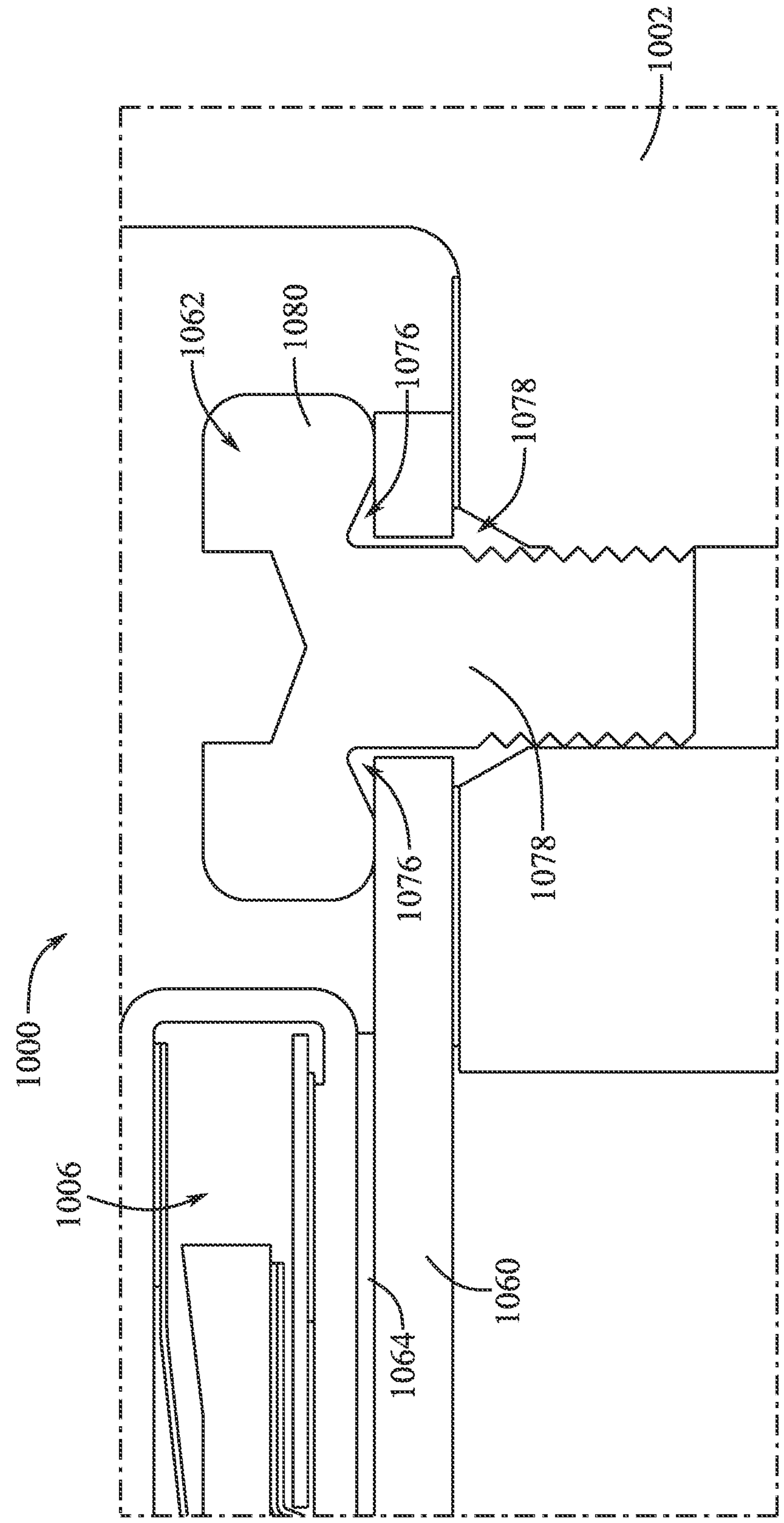
FIG. 10 shows a partial cross-sectional view of an example of an electronic device including a fastener for securing a display assembly.

FIG. 10 illustrates a partial cross-sectional view of another example of a device 1000 including a housing 1002 and a display assembly 1006 assembled with the housing 1002 via a stiffener 1060 fastened to the housing 1002 via a fastener 1062. As noted above with reference to other examples, the display assembly 1006 can be fixed to the stiffener 1060 via an adhesive strip or layer 1064. The stiffener 1060 can be pressed against the housing 1002 via a head 1080 of the fastener 1062. A shaft 1078 of the fastener 1062 can include a threaded portion and an upper unthreaded portion, as shown in FIG. 10.

In at least one example, a transitional geometry between the head 1080 and the shaft 1078 can include a recessed a groove 1076. The recessed groove 1076 can extend upward from a lower surface of the head 1080 of the fastener 1062 such that a chamfer or transition between the head and a shaft 1078 of the fastener 1062 is positioned above the top surface of the stiffener 1060. In this way, the recessed groove 1076 between the head 1080 in the shaft 1078 reduces a clearance 1079 between the shaft 1078 and the stiffener 1060. In at least one example, due at least in part to the recessed groove 1076, the clearance 1079 can be less than about 100 microns. In at least one example, the clearance 1079 can be less than about 75 μm, for example about 50 μm or less.

Any of the features, components, and/or parts, including the arrangements and configurations thereof shown in FIG. 10 can be included, either alone or in any combination, in any of the other examples of devices, features, components, and parts shown in the other figures. Likewise, any of the features, components, and/or parts, including the arrangements and configurations thereof shown in the other figures can be included, either alone or in any combination, in the example of the devices, features, components, and parts shown in FIG. 10.

Figure 11A:
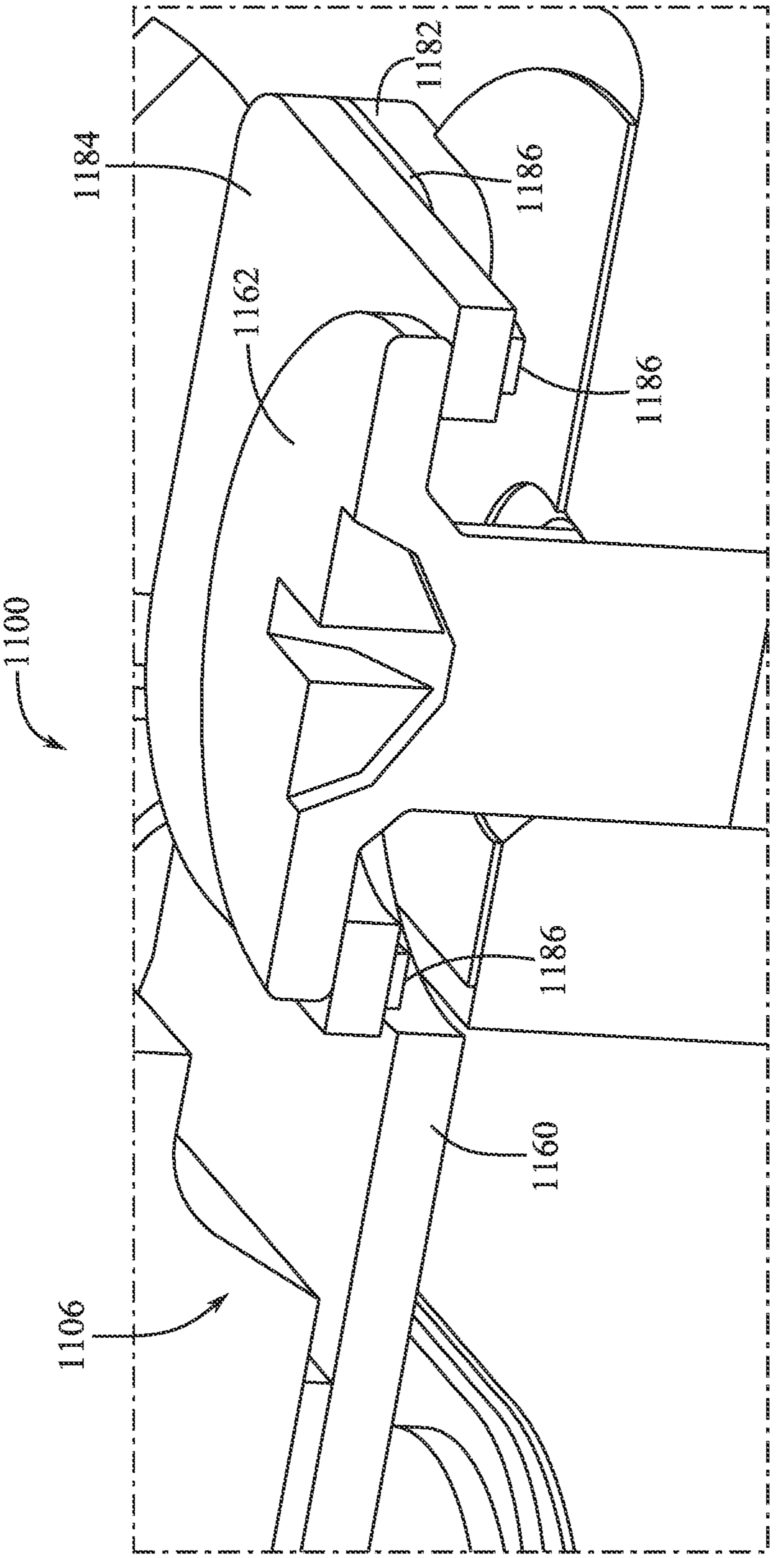
FIG. 11A shows a partial perspective cutaway view of an example of an electronic device including a fastener securing a display assembly.

FIG. 11A illustrates a partial cutaway view of another example of an electronic device 1100 including a display assembly 1106 having a lower metal chassis 1160. The fastener 1162 can secure the lower metal chassis 1160 to a housing of the device 1100 as shown in FIG. 11A. As the device 1100 is jostled, dropped, or otherwise impacted during use, a clearance between the shaft of the fastener 1162 and a through hole of the chassis 1160 can cause shifting from a drop incident as well as residual shifting of the chassis 1160, and thus the display 1106, relative to the housing of the device 1100.

In at least one example, in order to maintain a compressive load at the interface between the lower metal chassis 1160 of the display 1106 and the housing, a reinforcement washer 1184 can be disposed between a head of the fastener 1162 and a tab 1182 of the metal chassis 1160 defining the through hole through which the fastener 1162 extends. In at least one example, the reinforcement washer 1184 disposed between the fastener 1162 and the chassis tab 1182 can be secured to the chassis tab 1182 via an adhesive layer 1186.

Figure 11B:
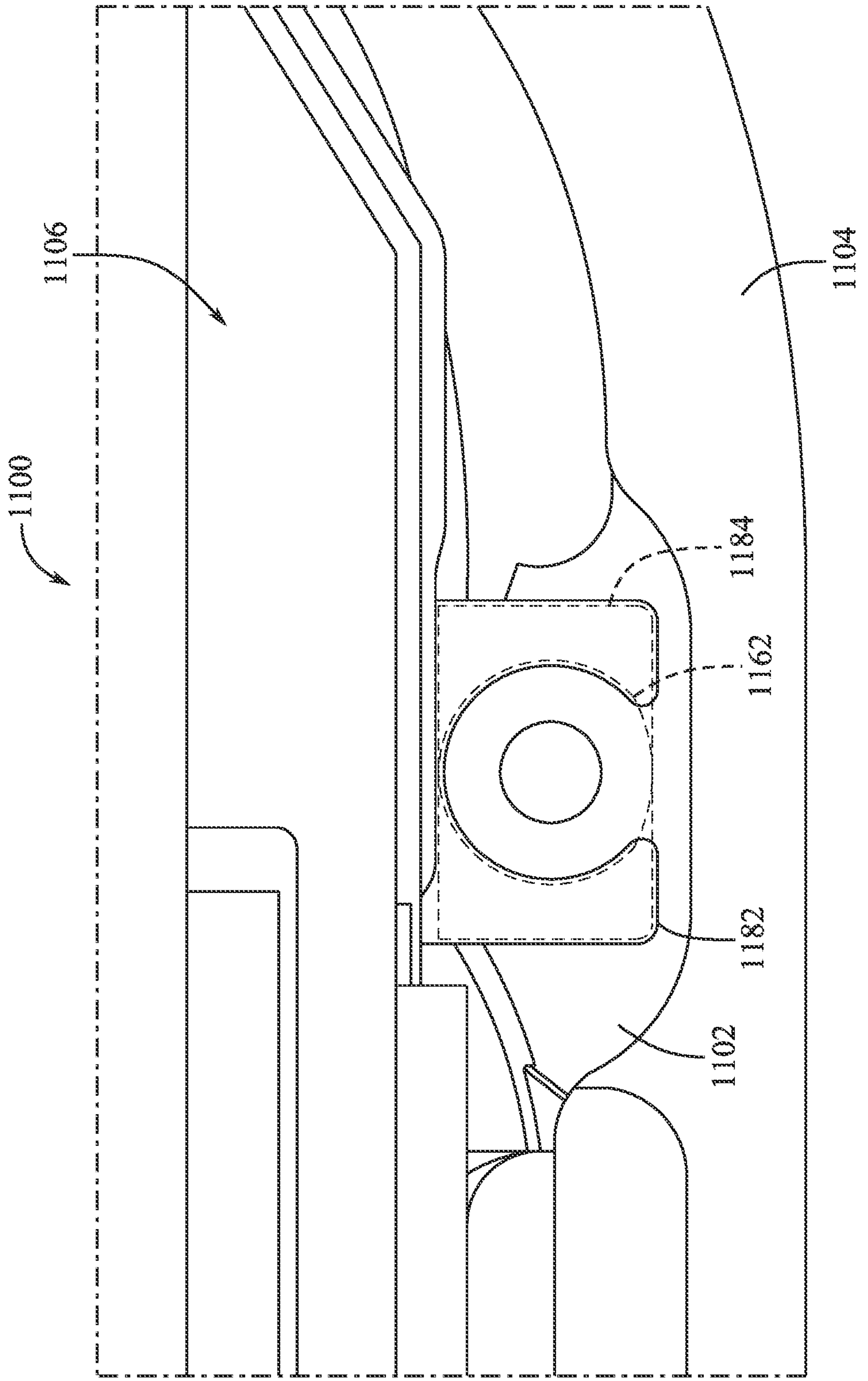
FIG. 11B shows a top view of an example of an electronic device including a fastener securing a display assembly.

In at least one example, the adhesive layer 1186 can include a conductive pressure sensitive adhesive. During a drop event or shifting of the metal chassis 1160 relative to the housing of the device 1100, the adhesive layer 1186 can be configured to shear to maintain compression of the metal chassis 1160 against the housing of the device 1100 due to the fastener 1162. FIG. 11B illustrates a top view of the portion of the electronic device 1100 shown in FIG. 11A, including the display assembly 1106 and the sidewall 1104 of the housing 1102. The top view shown in 11B illustrates the chassis tab 1182 extending over the housing 1102 and the dotted lines represent the position of the reinforcement washer 1184 and the head of the fastener 1162 as would be positioned if present as shown in FIG. 11A.

Any of the features, components, and/or parts, including the arrangements and configurations thereof shown in FIGS. 11A and 11B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 11A and 11B.

Figure 12:
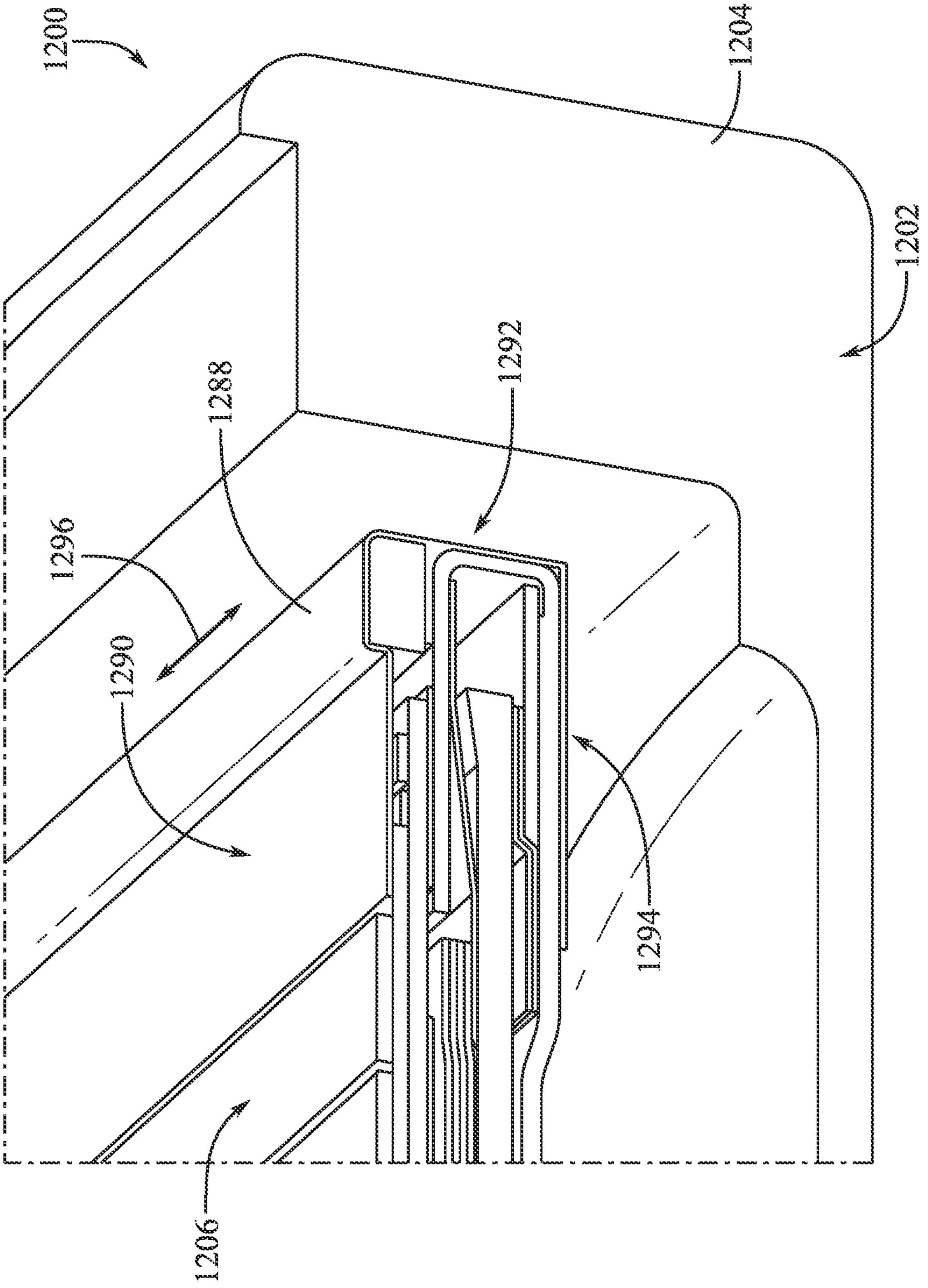
FIG. 12 shows a partial cutaway view of an example of an electronic device including a display assembly.

FIG. 12 illustrates a partial cutaway view of another example of an electronic device 1200 including a housing 1202 defining a sidewall 1204. The electronic device 1200 also includes a display assembly 1206 having an edge extending in a longitudinal direction indicated at arrow 1296. In at least one example, at least portions of the display 1206 at an edge extending in the longitudinal direction 1296 are not adhered to a stiffener as noted above with reference to other examples shown in other figures. Rather, in at least one example, the device 1200 includes a conductive adhesive 1288 extending around an edge of the display 1206. In at least one example, the conductive adhesive 1288 extends from a top portion 1292 to a bottom portion 1294 around an outer edge portion 1292.

In at least one example, one or more other portions of an edge of the display 1206 can include structural adhesive extending along the bottom 1294 of the display assembly 1206, for example adhesive strips adhering the display assembly 1206 to a stiffener as described above with reference to other figures. The adhesive strips described above can include discrete sections separated by a distance where the conductive adhesive 1288 shown in FIG. 12 can extend underneath the edge of the display assembly 1206 without interference from the structural adhesive strip. Other sections of the edge of the display 206 along the longitudinal direction 1296 can include the structural adhesive in the form of the adhesive strip between the stiffener and the display 1206 without the presence of the conductive adhesive 1288. In this way, the weaker conductive adhesive 1288 (weaker compared to the structural adhesive of the adhesive strips) can avoid failure due to strain imposed by shear forces from overlapping adhesive strips between the display assembly 1206 and the stiffener and/or the housing 1202 during a drop event or impact.

Any of the features, components, and/or parts, including the arrangements and configurations thereof shown in FIG. 12 can be included, either alone or in any combination, in any of the other examples of devices, features, components, and parts shown in the other figures. Likewise, any of the features, components, and/or parts, including the arrangements and configurations thereof shown in the other figures can be included, either alone or in any combination, in the example of the devices, features, components, and parts shown in FIG. 12.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A sensor retention assembly for an electronic device, the sensor retention assembly comprising:

- a sensor carrier;
- a datum pressing against the sensor carrier in a first direction and limiting a movement of the sensor carrier relative to a housing of the electronic device;
- a spring finger pressing the sensor carrier in a second direction against the datum, the second direction opposite the first direction; and
- a compression block pressing the sensor carrier in the second direction against the datum.

2. The sensor retention assembly of claim 1, the spring finger comprising an engagement portion contacting the sensor carrier and a base portion pressing against the housing, the housing defining an external surface and an internal volume of the electronic device.

3. The sensor retention assembly of claim 2, wherein:

- the base portion is fixed to the housing; and
- a spring force from the spring finger maintains contact between the engagement portion and the sensor carrier.

4. The sensor retention assembly of claim 3, wherein the spring finger biases the sensor carrier away from the housing.

5. The sensor retention assembly of claim 3, wherein the compression block includes:

- a first end pressing against the sensor carrier; and
- a second end opposite the first end, the second end pressing against the housing.

6. The sensor retention assembly of claim 1, the compression block comprising foam.

7. The sensor retention assembly of claim 1, further comprising a camera carried by the carrier, the camera including a lens and a housing secured in position by the sensor carrier.

* * * * *